US008691692B2

(12) United States Patent
Lim et al.

(10) Patent No.: US 8,691,692 B2
(45) Date of Patent: Apr. 8, 2014

(54) SEMICONDUCTOR CHIPS AND METHODS OF FORMING THE SAME

(71) Applicant: Samsung Electronics Co., Ltd., Suwon-si (KR)

(72) Inventors: Dong-Chan Lim, Suwon-si (KR); Gilheyun Choi, Seoul (KR); Kwangjin Moon, Suwon-si (KR); Deok-Young Jung, Seoul (KR); Byung-Lyul Park, Seoul (KR); Dosun Lee, Gwangju (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/966,531

(22) Filed: Aug. 14, 2013

(65) Prior Publication Data

US 2013/0344695 A1    Dec. 26, 2013

Related U.S. Application Data

(62) Division of application No. 13/289,624, filed on Nov. 4, 2011.

(30) Foreign Application Priority Data

Nov. 16, 2010    (KR) .................. 10-2010-0114022

(51) Int. Cl.
*H01L 21/4763* (2006.01)
*H01L 21/44* (2006.01)

(52) U.S. Cl.
USPC ..................... 438/667; 438/629; 438/672

(58) Field of Classification Search
USPC .................................... 438/629, 667, 672
See application file for complete search history.

(56) References Cited

U.S. PATENT DOCUMENTS

| 7,329,943 | B2* | 2/2008 | Kirby et al. .................. 257/621 |
| 8,143,704 | B2 | 3/2012 | West |
| 8,405,201 | B2* | 3/2013 | Lin et al. ...................... 257/698 |
| 2003/0101581 | A1 | 6/2003 | Kresge et al. |
| 2009/0008780 | A1* | 1/2009 | Kirby ........................... 257/751 |
| 2010/0025825 | A1 | 2/2010 | DeGraw et al. |
| 2010/0038788 | A1* | 2/2010 | Kim et al. .................... 257/751 |
| 2010/0123175 | A1* | 5/2010 | Kanaya ........................ 257/295 |
| 2010/0123256 | A1* | 5/2010 | Yoda et al. ................... 257/774 |
| 2010/0182041 | A1 | 7/2010 | Feng et al. |
| 2010/0230818 | A1* | 9/2010 | Birner et al. ................. 257/751 |
| 2010/0276786 | A1* | 11/2010 | Cotte et al. .................. 257/621 |
| 2011/0108988 | A1* | 5/2011 | Lim et al. ..................... 257/751 |
| 2012/0133047 | A1* | 5/2012 | Besling et al. ............... 257/774 |

FOREIGN PATENT DOCUMENTS

| JP | 2004-221347 | 8/2004 |
| JP | 2008-071842 | 3/2008 |
| JP | 2010-103470 | 5/2010 |
| KR | 1020100045333 | 5/2010 |

* cited by examiner

*Primary Examiner* — James Mitchell
(74) *Attorney, Agent, or Firm* — F. Chau & Associates, LLC

(57) ABSTRACT

Provided are a semiconductor chip and a method of manufacturing the same. The semiconductor chip includes a substrate having a first side and a second side facing each other, and a through electrode being disposed in a hole penetrating the substrate, wherein an opening surrounded by the through electrode is disposed in the hole, wherein the opening comprises a first end adjacent to the first side of the substrate and a second end adjacent to the second side of the substrate.

9 Claims, 11 Drawing Sheets

SEMICONDUCTOR CHIPS AND METHODS OF FORMING THE SAME

CROSS-REFERENCE TO RELATED APPLICATION

This U.S. non-provisional patent application is a divisional application of co-pending U.S. application Ser. No. 13/289,624 filed Nov. 4, 2011, which claims priority under 35 U.S.C. §119 to Korean Patent Application No. 10-2010-0114022, filed on Nov. 16, 2010, the disclosures of which are each hereby incorporated by reference herein in their entireties.

BACKGROUND

The present inventive concept herein relates to semiconductor chips and methods of forming the same, and more particularly, to semiconductor chips including a through electrode and methods of forming the same.

Requirements for high reliability, high performance, multi-function, high speed, miniaturization and light weight of products in the electronics industry, such as cell phones, note book computers, etc. have been increasing. In order to satisfy these requirements, studies on semiconductor packages are being performed. Connections between integrated circuits using wire bonding (referred to as two-dimensional connections) may result in high power consumption, design method limitations, signal loss in a wire, etc. Alternatively, a three-dimensional integrated circuit package technique connecting semiconductor chips stacked by a vertical interconnection line has been suggested. The vertical interconnection line connecting the semiconductor chips vertically is referred to as a through silicon via (TSV). The three-dimensional integrated circuit package technique using the through silicon via (TSV) allows for more integrated circuits in the same space and a shorter connection between circuits. Studies to improve reliability and electrical characteristics of semiconductor packages using the three-dimensional integrated circuit package technique including the through silicon via (TSV) have been performed.

SUMMARY

Embodiments of the inventive concept provide a semiconductor chip. According to an embodiment, the semiconductor chip includes a substrate having a first side and a second side facing each other; and a through electrode being disposed in a hole penetrating the substrate, wherein an opening surrounded by the through electrode is disposed in the hole, wherein the opening comprises a first end adjacent to the first side of the substrate and a second end adjacent to the second side of the substrate.

Embodiments of the inventive concept also provide a method of forming a semiconductor chip. According to an embodiment, the method includes forming a hole extending from a first side of a substrate toward a second side of the substrate, wherein the first side and second side face each other, forming a through electrode in the hole, wherein an opening surrounded by the through electrode is formed in the hole and a first end and a second end of the opening are sealed by the through electrode, and etching the second side of the substrate to expose the through electrode.

According to an embodiment, a semiconductor device comprises a substrate, a through electrode penetrating the substrate, and an opening in the through electrode, wherein the opening is surrounded on all sides of the opening by the through electrode.

BRIEF DESCRIPTION OF THE FIGURES

The foregoing and other features embodiments of the inventive concept will be apparent from the more particular description of exemplary aspects of the inventive concept, as illustrated in the accompanying drawings in which like reference characters may refer to the same or similar parts throughout the different views. The drawings are not necessarily to scale, emphasis instead being placed upon illustrating the principles of the inventive concept. In the drawings, the thickness of layers and regions may be exaggerated for clarity.

DETAILED DESCRIPTION OF THE EMBODIMENTS

Figure 1:
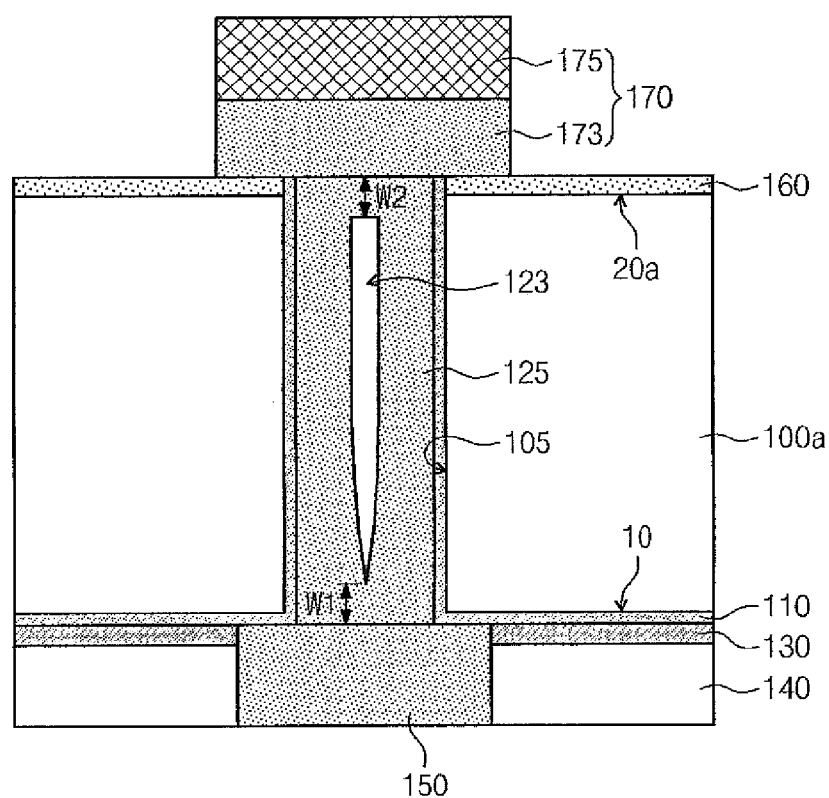
FIG. 1 is a cross sectional view illustrating a semiconductor chip in accordance with an embodiment of the inventive concept.

Exemplary embodiments of the inventive concept will be described below in more detail with reference to the accompanying drawings. The embodiments of the inventive concept may, however, be embodied in different forms and should not be constructed as limited to the embodiments set forth herein.

In the drawings, the thickness of layers and regions may be exaggerated for clarity. It will be understood that when an element such as a layer, region or substrate is referred to as being "on" or "onto" another element, it may lie directly on the other element or intervening elements or layers may also be present. Like reference numerals refer to like elements throughout the specification.

Embodiments of the inventive concept may be described with reference to cross-sectional illustrations, which are schematic illustrations of idealized embodiments of the present inventive concept. As such, variations from the shapes of the illustrations, as a result of, for example, manufacturing techniques and/or tolerances, may occur. Thus, the regions illustrated in the figures are not intended to limit the scope of the present inventive concept.

FIG. 1 is a cross sectional view illustrating a semiconductor chip in accordance with an embodiment of the inventive concept.

Referring to FIG. 1, a semiconductor chip includes a substrate 100a having a first side 10 and a second side 20a facing each other. The substrate 100a includes semiconductor material. For example, the substrate 100a may include at least one of silicon and germanium. According to an embodiment, a semiconductor integrated circuit is included on the first side 10 of the substrate 100a. The semiconductor integrated circuit may include at least one of a transistor, a diode, a capacitor and a resistor.

The semiconductor chip in accordance with an embodiment of the inventive concept includes a through electrode 125 disposed in a hole 105 penetrating the substrate 100a. The hole 105 includes a first end adjacent to the first side 10 of the substrate 100a and a second end adjacent to the second side 20a of the substrate 100a. According to the present embodiment, the through electrode 125 is a single layer. The through electrode 125 includes conductive material. For example, the through electrode 125 may include at least one of polycrystalline silicon, metal (e.g., aluminum, copper, titanium, tantalum or tungsten) and conductive nitride (e.g., titanium nitride or tantalum nitride).

The through electrode 125 includes a plane portion closing the second end of the hole 105 and a sidewall portion extending from an edge of the plane portion to cover a side surface of the hole 105. Depending on the shape of the hole, the plane portion may have multiple edges and there may be multiple sidewall portions corresponding to multiple side surfaces. According to an embodiment, an end of the sidewall portion of the through electrode 125 adjacent to the first side 10 of the substrate 100a extends beyond the first side 10 to form an overhang portion. The overhung end of the sidewall portion closes the first end of the hole 105. Thus, a cross section of the through electrode 125 may have a closed loop shape. According to an embodiment, an opening 123 is disposed inside the hole 105.

The through electrode 125 includes a first end surface adjacent to the first side 10 of the substrate 100a and a second end surface adjacent to the second side 20a of the substrate 100a. Also, the opening 123 includes a first end adjacent to the first side 10 of the substrate 100a and a second end adjacent to the second side 20a of the substrate 100a. The first and second ends of the opening 123 are closed by the through electrode 125. Thus, the opening 123 has a shape completely surrounded by the through electrode 125.

According to an embodiment, the shortest distance W1 between the first end surface of the through electrode 125 and the first end of the opening 123 is greater than the shortest distance W2 between the second end surface of the through electrode 125 and the second end of the opening 123. Thus, the center of the opening 123 is closer to the second side 20a of the substrate 100a than the first side 10 of the substrate 100a. Alternatively, the shortest distance W1 between the first end surface of the through electrode 125 and the first end of the opening 123 is less than the shortest distance W2 between the second end surface of the through electrode 125 and the second end of the opening 123. Thus, the center of the opening 123 is closer to the first side 10 of the substrate 100a than the second side 20a of the substrate 100a. In another alternative, W1 and W2 are equal to each other.

According to the present embodiment, the semiconductor chip includes the opening 123 surrounded by the through electrode 125 on the inside of the hole 105. The through electrode 125 may be thermally expanded by a subsequent high temperature process. If the through electrode 125 has a shape of wholly filling the hole 105, and does not include the opening 123, the through electrode 125 may be thermally expanded by a subsequent high temperature process to protrude toward the outside of the hole 105. In this case, lifting and/or breaking of a film formed on the through electrode 125 may occur. Also, the substrate 100a may crack due to pressure from the thermal expansion. However, according to the present embodiment, since the opening 123 is located inside the hole 105, even though the through electrode 125 is thermally expanded, expansion of the through electrode 125 outside the hole 105 is minimal. In other words, the opening 123 provides a space for the through electrode 125 to expand so that expansion is not directed outside the hole 105. Also, an occurrence of cracks in the substrate 100a by a pressure due to the thermal expansion of the through electrode 125 is minimized. Consequently, unwanted damage or rearrangements that may occur by a thermal expansion of the through electrode 125 may be minimized. Thus, a resulting semiconductor chip has improved reliability and improved electrical characteristics.

According to an embodiment, a first dielectric film 110 is disposed between a sidewall of the through electrode 125 and a sidewall of the hole 105. The first dielectric film 110, as illustrated, extends to cover the first side 10 of the substrate 100a. The first dielectric film 110 includes, for example, at least one of silicon oxide, silicon nitride and silicon oxynitride.

An etch stop film 130 and an interlayer dielectric film 140 are disposed on the first side 10 of the substrate 100a. The etch stop film 130 includes at least one of silicon oxide, silicon nitride and silicon oxynitride. The interlayer dielectric film 140 also includes at least one of silicon oxide, silicon nitride and silicon oxynitride. According to an embodiment, the etch stop film 130 and the interlayer dielectric film 140 include different materials from each other. For example, the etch stop film 130 may include silicon nitride and the interlayer dielectric film 140 may include silicon oxide. According to an embodiment, the etch stop film 130 may be omitted.

An interconnection 150 electrically connected to the through electrode 125 is disposed in the etch stop film 130 and the interlayer dielectric film 140. According to an embodiment, the interconnection 150 is in contact with the through electrode 125. The interconnection 150 includes at least one of metal (e.g., aluminum, copper, titanium and tantalum) and conductive nitride (e.g., titanium nitride and tantalum nitride).

In FIG. 1, the interconnection 150 is illustrated in a single layer. However, the embodiments of the inventive concept are not limited thereto. Unlike that illustrated in FIG. 1, multi-layer interconnections electrically connected to the through electrode 125 may be disposed on the first side 10 of the substrate 100a.

A second dielectric film 160 is disposed on the second side 20a of the substrate 100a. An opening in the second dielectric film 160 exposes the second end surface of the through electrode 125 adjacent to the second side 20a of the substrate 100a. The second dielectric film 160 includes at least one of silicon oxide, silicon nitride and silicon oxynitride.

A bump 170 electrically connected to the through electrode 125 is disposed on the second dielectric film 160. The bump 170 includes a first conductive pad 173 and a second conductive pad 175. The first and second conductive pads 173 and 175 may include metal. For example, the first and second conductive pads 173 and 175 include at least one of aluminum, copper and nickel. According to an embodiment, the first and second conductive pads 173 and 175 include different metals from each other. For example, the first conductive pad 173 may include copper and the second conductive pad 175 may include nickel.

However, the embodiments of the inventive concept are not limited thereto. According to an embodiment, a semiconductor chip in accordance with an embodiment of the inventive concept includes a conductive pad that is in contact with the exposed through electrode 125 and/or in contact with solder on the conductive pad. According to another embodiment, the bump 170 may be omitted and the through electrode 125 may be directly connected to one of a printed circuit board (PCB), an interposer device and another semiconductor chip.

FIGS. 2A through 2E are cross sectional views illustrating a method of forming a semiconductor chip in accordance with an embodiment of the inventive concept.

Figure 2A:
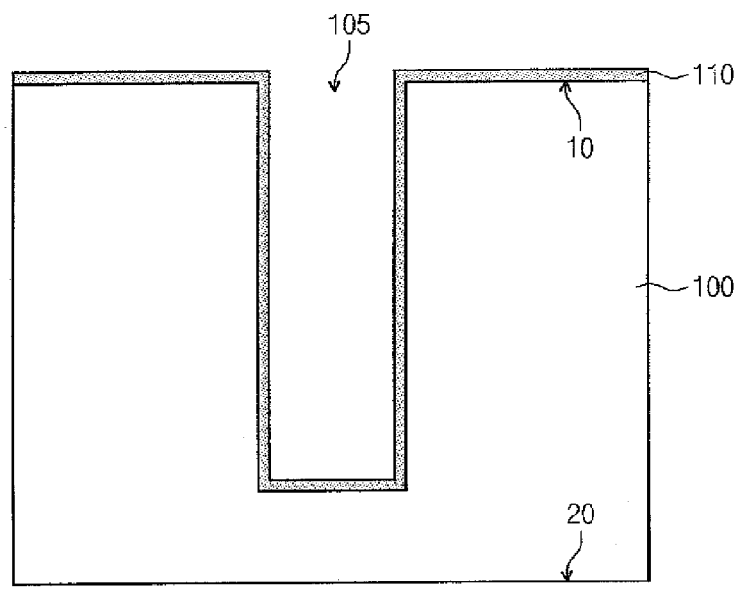
FIGS. 2A through 2E are cross sectional views illustrating a method of forming a semiconductor chip in accordance with an embodiment of the inventive concept.

Referring to FIG. 2A, a substrate 100 having a first side 10 and a second side 20 facing each other is prepared. The substrate 100 may include semiconductor material. For example, the substrate 100 may include at least one of silicon and germanium. According to an embodiment, a semiconductor integrated circuit is formed on the first side of the substrate 100. The semiconductor integrated circuit includes at least one of a transistor, a diode, a capacitor and a resistor. According to an embodiment, the structures described above are not formed on the second side 20 of the substrate 100.

A hole 105 extending from the first side 10 toward the second side 20 of the substrate 100 is formed in the substrate 100. According to an embodiment, the hole 105 is formed by forming a mask pattern on the first side 10 of the substrate 100 and then etching the substrate 100 using the mask pattern as an etching mask. The etching process may be performed by one or more dry etching processes.

A first dielectric film 110 is formed on the first side 10 of the substrate 100. The first dielectric film 110 is conformally formed on the first side 10 of the substrate 100 and on an inner side of the hole 105. The first dielectric film 110 may be formed by a chemical vapor deposition (CVD) process or an atomic layer deposition (ALD) process. The first dielectric film 110 includes at least one of silicon oxide, silicon nitride and silicon oxynitride.

Figure 2B:
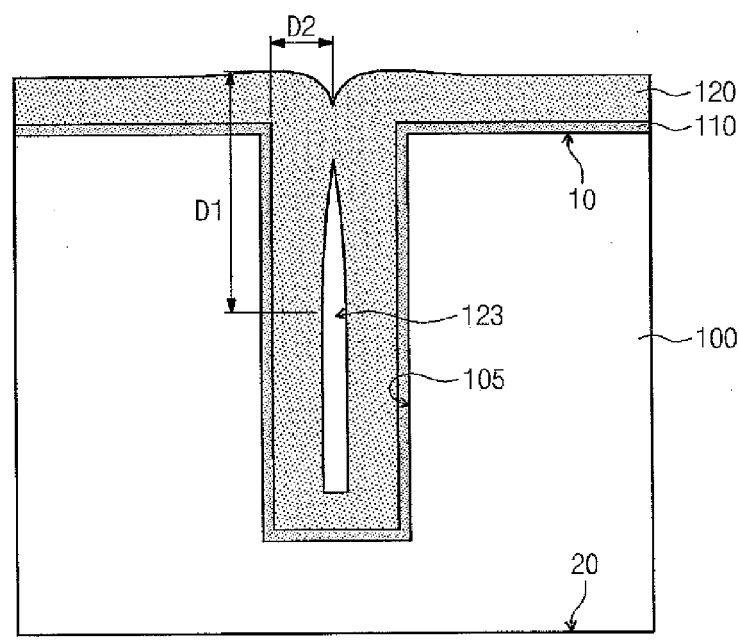

Referring to FIG. 2B, a conductive film 120 partly filling the hole 105 is formed on the first side 10 of the substrate 100. The conductive film 120 includes conductive material. For example, the conductive film 120 may include at least one of polycrystalline silicon, metal (e.g., aluminum, copper, titanium, tantalum or tungsten) and conductive nitride (e.g., titanium nitride or tantalum nitride). The conductive film 120 is formed by at least one of a chemical vapor deposition (CVD) process, a physical vapor deposition (PVD) process and an electroplating process.

The conductive film 120 is formed on the first side 10 of the substrate 100 and on an inner side of the hole 105. The conductive film 120 covering the entrance of the hole may be formed to extend beyond the entrance of the hole to form an overhang portion on the first side 10 of the substrate 100. A portion of the overhung conductive film 120 closes the top of the hole 105. An opening 123 surrounded by the conductive film 120 is formed.

The opening 123 includes a first end adjacent to the first side 10 of the substrate 100 and a second end adjacent to the second side 20 of the substrate 100. The first and second ends of the opening 123 are formed to be closed by the conductive film 120. The opening 123 is formed inside the hole 105. The opening 123 is completely surrounded by the conductive film 120.

According to an embodiment, the conductive film 120 is formed by an electroplating process. A thickness of the conductive film 120 is controlled by controlling an amount of current being applied to the substrate 100 and a time during which the electroplating process occurs. For example, as the amount of current applied to the substrate 100 increases, a thickness of the conductive film 120 increases and as the time for which the electroplating process progresses increases, a thickness of the conductive film 120 increases.

As a thickness of the conductive film 120 increases, a thickness of the conductive film 120 formed on a bottom surface of the hole 105 increases. As a result, the center of the opening 123 may be located closer to the entrance of the hole 105 than the bottom surface of the hole 105. Alternatively, in the case that a thickness of the conductive film 120 is formed to be relatively small, the center of the opening 123 is located closer to the bottom surface of the hole 105 than the entrance of the hole 105.

Also, according to an embodiment, a critical amount of current is applied to the substrate 100 during the electroplating process so that the conductive film 120 includes an overhang portion covering the entrance of the hole 105. A critical amount of current may refer to an amount of current required to form an overhang from the entrance of the hole 105. According to an embodiment, the overhang portion of the conductive film 120 includes a first width D1 perpendicular to the substrate 100 and a second width D2 parallel to the substrate 100. If a current greater than the critical amount of current is applied to the substrate 100, the second width D2 increases and the first width D1 decreases.

As the first width D1 of overhang portion of the conductive film 120 increases, the center of the opening 123 located closer to the bottom surface of the hole 105 than to the entrance of the hole 105.

Figure 2C:
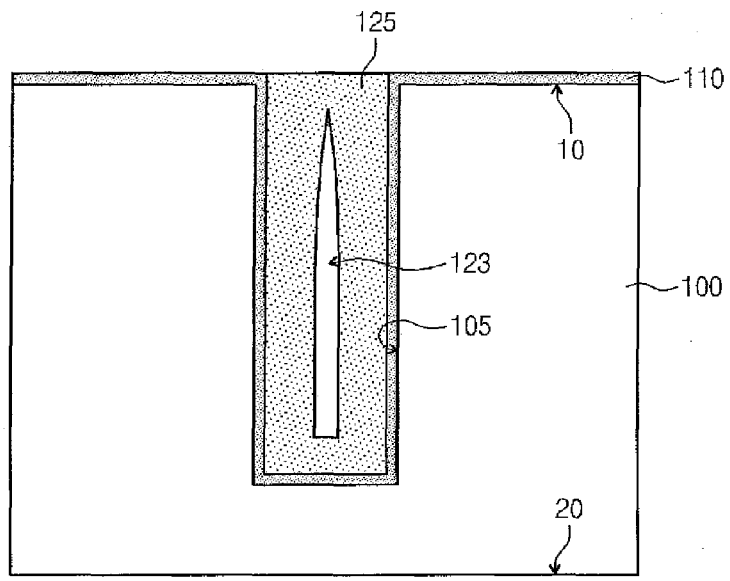

Referring to FIG. 2C, a through electrode 125 is formed by removing the conductive film 120 of the outside of the hole 105. The through electrode 125 includes a plane portion disposed on a bottom surface of the hole 105 and a sidewall portion extending from an edge of the plane portion to cover a side of the hole 105 extending from the plane portion. Depending on the shape of the hole, the plane portion may have multiple edges and there may be multiple sidewall portions corresponding to multiple side surfaces. Since the conductive film 120 covering the entrance of the hole 105 includes the overhang portion, the end of the sidewall portion of the through electrode 125 extends beyond the entrance of the hole to form the overhang portion. The through electrode 125 includes a first end surface adjacent to the first side 10 of the substrate 100 and a second end surface adjacent to the second side 20 of the substrate 100.

The removing process may be performed by at least one of a chemical mechanical polishing (CMP) process or a dry etching process. Since the opening 123 is formed inside the hole 105, the opening 123 is not exposed by removing the outside conductive film 120 of the hole 105. That is, the first and second ends of the opening 123 may maintain a state in which the first and second ends are surrounded and closed by the through electrode 125.

According to an embodiment, the shortest distance between the first end surface of the through electrode 125 and the first end of the opening 123 is greater than the shortest distance between the second end surface of the through electrode 125 and the second end of the opening 123. Thus, according to an embodiment, the center of the opening 123 is formed to be closer to the bottom surface of the hole 105 than the entrance of the hole 105. Alternatively, the shortest distance between the first end surface of the through electrode 125 and the first end of the opening 123 is smaller than the shortest distance between the second end surface of the through electrode 125 and the second end of the opening 123. Thus, the center of the opening 123 is formed to be closer to the entrance of the hole 105 than to the bottom surface of the hole 105.

According to the present embodiment, the opening 123 surrounded by the through electrode 125 is formed inside the hole 105. The through electrode 125 may be thermally expanded by a subsequent high temperature process. If the through electrode 125 is formed to fully fill the hole 105, and does not include the opening 123, the through electrode 125 is thermally expanded by a subsequent high temperature process to protrude toward the outside of the hole 105. As a result, lifting and/or breakage of a film formed on the through electrode 125 may occur. Also, one or more cracks may be formed in the substrate 100 by pressure due to a thermal expansion. However, according to the present embodiment, since the opening 123 is formed inside the hole 105, even though the through electrode 125 is thermally expanded, the through electrode 125 may be minimally expanded outside the hole 105. Instead, the through electrode 125 may expand into the opening 123. As a result, an occurrence of cracks in the substrate 100 by pressure due to a thermal expansion of the through electrode 125 may be minimized. Consequently, unwanted damage or rearrangements that may occur by a thermal expansion of the through electrode 125 may be minimized. Thus, a semiconductor chip having improved reliability and improved electrical characteristics may be formed.

Figure 2D:
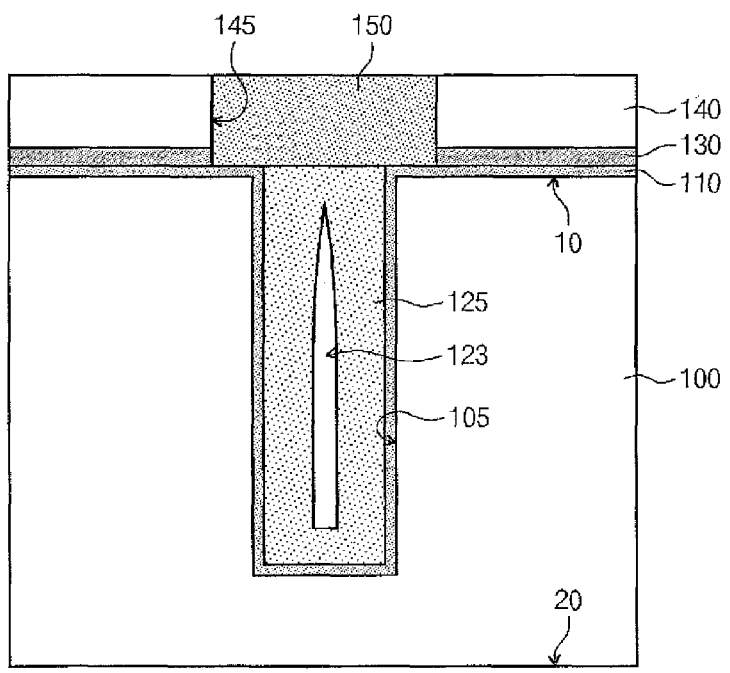

Referring to FIG. 2D, an etch stop film 130 and an interlayer dielectric film 140 are disposed on the first side 10 of the substrate 100. The etch stop film 130 and the interlayer dielectric film 140 may be formed by a chemical vapor deposition (CVD) process, a physical vapor deposition (PVD) process or an atomic layer deposition (ALD) process. The etch stop film 130 includes at least one of silicon oxide, silicon nitride and silicon oxynitride. The interlayer dielectric film 140 also includes at least one of silicon oxide, silicon nitride and silicon oxynitride. According to an embodiment, the etch stop film 130 and the interlayer dielectric film 140 include different materials from each other. For example, the etch stop film 130 may include silicon nitride and the interlayer dielectric film 140 may include silicon oxide. According to an embodiment, the etch stop film 130 may be omitted.

According to an embodiment, an opening 145 exposing the first side 10 of the substrate 100 and the end of the through electrode 125 adjacent to the first side 10 is formed by successively patterning the interlayer dielectric film 140 and the etch stop film 130. An interconnection 150 electrically connected to the through electrode 125 is formed by filling the opening 145 with conductive material. The opening 145 is filled with conductive material to form an interconnection 150 electrically connected to the through electrode 125. The interconnection 150 is connected to the through electrode 125 exposed by the opening 145. The interconnection 150 includes at least one of polycrystalline silicon, metal (e.g., aluminum, copper, titanium, tantalum or tungsten) and conductive nitride (e.g., titanium nitride or tantalum nitride).

Alternatively, the interconnection 150 is formed by a patterning process by forming a conductive film on the first side 10 of the substrate 100 and then patterning the conductive film. In this case, the interconnection dielectric film 140 and/or the etch stop film 130 are formed on the first side 10 of the substrate 100 after forming the interconnection 150.

In FIG. 2D, the interconnection 150 is illustrated as a single layer. However, the embodiments of the present inventive concept are not limited thereto. Unlike that illustrated in FIG. 2D, multilayer interconnections electrically connected to the through electrode 125 may be formed on the first side 10 of the substrate 100a.

Figure 2E:
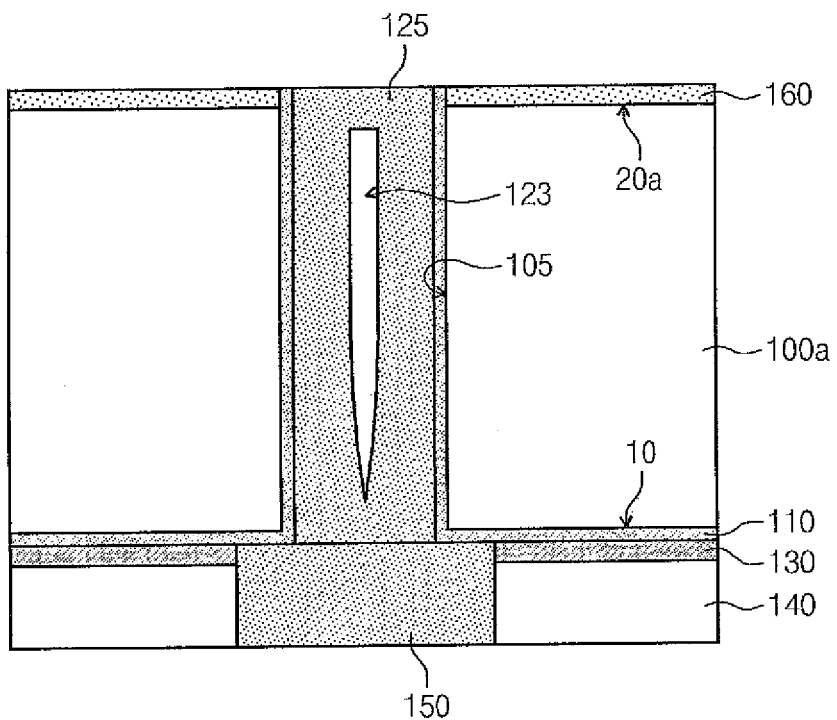

Referring to FIG. 2E, the through electrode 125 is exposed by etching the second side 20 of the substrate 100 and a portion of the first dielectric film 110. An etched substrate 100a and an etched second side 20a are defined by etching the second side 20 of the substrate 100.

A thickness of the substrate 100 is reduced by the etching process. Also, a portion of the first dielectric film 110 on the through electrode 125 may be removed by the etching process. The etching process may be performed by at least one of a grinding process, a dry etching process, a wet etching process and a chemical mechanical polishing (CMP) process.

A second dielectric film 160 is formed on the etched second side 20a of the etched substrate 100a. An open portion in the second dielectric film 160 exposes the through electrode 125. The second dielectric film 160 may be formed by a thermal oxidation process, a chemical vapor deposition (CVD) process, a physical vapor deposition (PVD) process or an atomic layer deposition (ALD) process. The second dielectric film 160 includes at least one of silicon oxide, silicon nitride and silicon oxynitride.

According to an embodiment, as illustrated in FIG. 1, a bump 170 connected to the exposed through electrode 125 is formed on the etched second side 20a of the etched substrate 100a. The bump 170 includes a first conductive pad 173 and a second conductive pad 175. The first and second conductive pads 173 and 175 include metal. For example, the first and second conductive pads 173 and 175 may include at least one of aluminum, copper and nickel. However, the embodiments of the present inventive concept are not limited thereto. According to an embodiment, a conductive pad connected to the exposed through electrode 125 is formed on the etched second side 20a of the etched substrate 100a and/or in contact with solder is formed on the conductive pad. According to another embodiment, the bump 170 may be omitted.

Figure 3A:
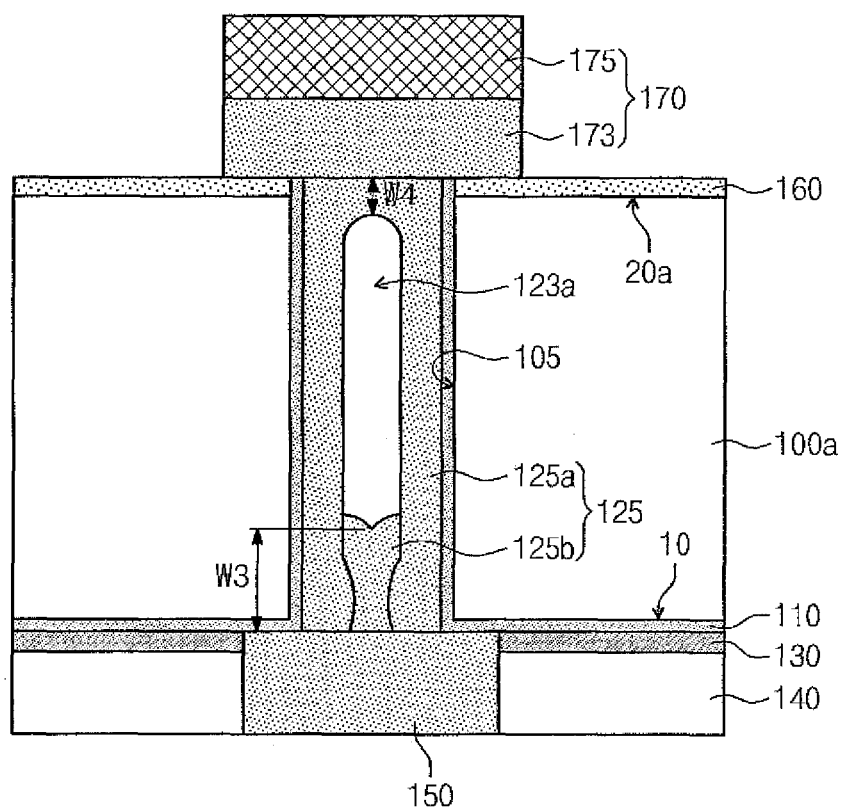
FIG. 3A is a cross sectional view illustrating a semiconductor chip in accordance with another embodiment of the inventive concept.

FIG. 3A is a cross sectional view illustrating a semiconductor chip in accordance with another embodiment of the inventive concept. Certain elements or features of the semiconductor chip in accordance with the present embodiment may be same as those of the previously described embodiments. Descriptions of the same elements or features may be omitted.

Referring to FIG. 3A, a semiconductor chip in accordance with an embodiment of the inventive concept includes a substrate 100a having a first side 10 and a second side 20a facing each other. The substrate 100a includes semiconductor material. For example, the substrate 100a includes at least one of silicon and germanium. According to an embodiment, a semiconductor integrated circuit may be included on the first side 10 of the substrate 100a. The semiconductor integrated circuit may include at least one of a transistor, a diode, a capacitor and a resistor. According to an embodiment, the second side 20a of the substrate 100a does not include these structures on the first side 10 of the substrate 100a.

The semiconductor chip in accordance with an embodiment of the inventive concept includes a through electrode 125 disposed in a hole 105 penetrating the substrate 100a. The hole 105 includes a first end adjacent to the first side 10 of the substrate 100a and a second end adjacent to the second side 20a of the substrate 100a. According to the present embodiment, the through electrode 125 includes a first conductive pattern 125a and a second conductive pattern 125b.

The first conductive pattern 125a includes a plane portion closing the second end of the hole 105 and a sidewall portion extending from an edge of the plane portion to cover a side surface of the hole 105. Depending on the shape of the hole, the plane portion may have multiple edges and there may be multiple sidewall portions corresponding to multiple side surfaces. For example, the first conductive pattern 125a may have a cylindrical shape, having a plane portion with a continuous edge and a continuous sidewall portion. An inner space surrounded by the first conductive pattern 125a is disposed in the hole 105. According to an embodiment, the first conductive pattern 125a includes the sidewall portion adjacent to the first side 10 of the substrate 100a that extends beyond the first side 10 to form and overhang portion. According to an embodiment, the inner space of the first conductive pattern 125a has a width at the first end of the hole 105 that is smaller than a width at the second end of the hole 105.

The second conductive pattern 125b closes the first end of the hole 105. An opening 123a surrounded by the first conductive pattern 125a and the second conductive pattern 125b is disposed in the hole 105. The opening 123a includes a first end adjacent to the first side 10 of the substrate 100a and the second end adjacent to the second side 20a of the substrate 100a. The first end of the opening 123 is closed by the second conductive pattern 125b and the second end of the opening 123a is closed by the first conductive pattern 125a. Thus, the opening 123a has a shape that is completely surrounded by the through electrode 125.

The first conductive pattern 125a includes at least one of polycrystalline silicon, metal (e.g., aluminum, copper, titanium, tantalum or tungsten) and conductive nitride (e.g., titanium nitride or tantalum nitride). The second conductive pattern 125b also includes at least one of polycrystalline silicon, metal (e.g., aluminum, copper, titanium, tantalum or tungsten) and conductive nitride (e.g., titanium nitride or tantalum nitride). According to an embodiment, the second conductive pattern 125b includes PVD-conductive material. According to an embodiment, the first conductive pattern 125a includes the same material as the second conductive pattern 125b, but is formed with a different process. For example, the first conductive pattern 125a includes copper formed by an electroplating process and the second conductive pattern 125b includes copper formed by a physical vapor deposition (PVD) process.

The through electrode 125 may includes a first end surface adjacent to the first side 10 of the substrate 100a and a second end surface adjacent to the second side 20a of the substrate 100a. According to an embodiment, the shortest distance W3 between the first end surface of the through electrode 125 and the first end of the opening 123a is greater than the shortest distance W4 between the second end surface of the through electrode 125 and the second end of the opening 123a. Thus, the center of the opening 123a is closer to the second side 20a of the substrate 100a than the first side 10 of the substrate 100a. Alternatively, the shortest distance W3 between the first end surface of the through electrode 125 and the first end of the opening 123a is smaller than the shortest distance W4 between the second end surface of the through electrode 125 and the second end of the opening 123a. Thus, the center of the opening 123a is closer to the first side 10 of the substrate 100a than the second side 20a of the substrate 100a.

According to the present embodiment, the opening 123a surrounded by the first conductive pattern 125a and the second conductive pattern 125b is disposed inside the hole 105. The through electrode 125 including the first conductive pattern 125a and the second conductive pattern 125b may be thermally expanded by a subsequent high temperature process. If the through electrode 125 has a shape of wholly filling the hole 105, and does not include the opening 123a, the through electrode 125 is thermally expanded by a subsequent high temperature process to protrude toward the outside of the hole 105. In this case, a lifting and/or breakage of a film formed on the through electrode 125 may occur. Also, cracks in the substrate 100a may form by pressure due to the thermal expansion. However, according to the present embodiment, since the opening 123a is located inside the hole 105, even though the through electrode 125 is thermally expanded, the through electrode 125 may be minimally expanded outside the hole 105. When the opening 123a is formed in the hole 105, the through electrode 125 can expand into the opening 123a instead of outside of the hole 105. Also, an occurrence of cracks in the substrate 100a by a pressure due to a thermal expansion of the through electrode 125 may be minimized. Consequently, unwanted damage or rearrangements that may occur by a thermal expansion of the through electrode 125 may be minimized. Thus, a semiconductor chip having improved reliability and improved electrical characteristics may be formed.

A first dielectric film 110 is disposed between a sidewall of the through electrode 125 and a sidewall of the hole 105. The first dielectric film 110 may be the same as that of the embodiments described above.

An etch stop film 130 and an interlayer dielectric film 140 is disposed on the first side 10 of the substrate 100a. The etch stop film 130 and the interlayer dielectric film 140 may be the same as those of the embodiments described above. According to an embodiment, the etch stop film 130 may be omitted.

An interconnection 150 electrically connected to the through electrode 125 is disposed in the etch stop film 130 and the interlayer dielectric film 140. The interconnection 150 includes at least one of metal (e.g., aluminum, copper, titanium and tantalum) and conductive nitride (e.g., titanium nitride and tantalum nitride).

In FIG. 3A, the interconnection 150 is illustrated as a single layer. However, the embodiment of the present inventive concept is not limited thereto. Unlike that illustrated in FIG. 3A, multilayer interconnections electrically connected to the through electrode 125 may be formed on the first side 10 of the substrate 100a.

A second dielectric film 160 is disposed on the second side 20a of the substrate 100a. The second dielectric film 160 may be the same as that of the embodiments described above.

A bump 170 electrically connected to the through electrode 125 is disposed on the second dielectric film 160. The bump 170 may be the same as that of the embodiments described above. According to an embodiment, the semiconductor chip in accordance with an embodiment of the inventive concept includes a conductive pad that is in contact with the exposed through electrode 125 and/or in contact with solder on the conductive pad. According to another embodiment, the bump 170 may be omitted, and the through electrode 125 may be directly connected to one of a printed circuit board (PCB), an interposer device and another semiconductor chip.

Figure 3B:
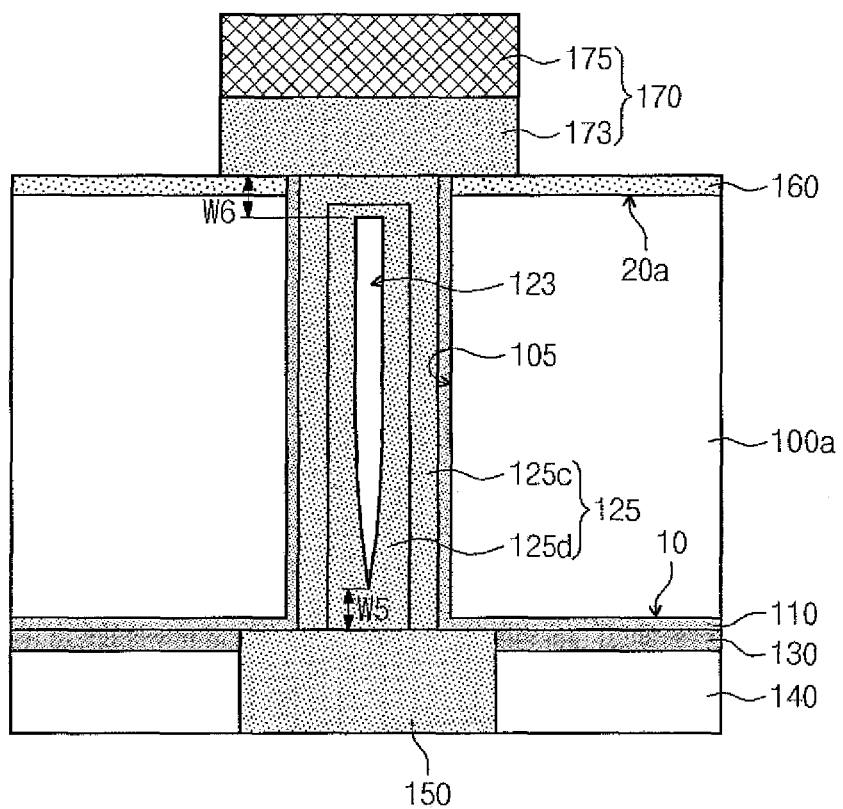
FIG. 3B is a cross sectional view illustrating an embodiment of a through electrode in a semiconductor chip in accordance with another embodiment of the inventive concept.

FIG. 3B is a cross sectional view illustrating a through electrode in a semiconductor chip in accordance with an embodiment of the inventive concept.

Referring to FIG. 3B, a through electrode 125 is disposed in a hole 105 penetrating the substrate 100a. The hole 105 includes a first end adjacent to the first side 10 of the substrate 100a and a second end adjacent to the second side 20a of the substrate 100a. The through electrode 125 includes a first conductive pattern 125c and a second conductive pattern 125d.

The first conductive pattern 125c includes a plane portion closing the second end of the hole 105 and a sidewall portion extending from an edge of the plane portion to cover a side surface of the hole 105. Depending on the shape of the hole, the plane portion may have multiple edges and there may be multiple sidewall portions corresponding to multiple side surfaces. For example, the first conductive pattern 125c may have a cylindrical shape, having a plane portion with a continuous edge and a continuous sidewall portion. Thus, an inner space surrounded by the first conductive pattern 125c is disposed in the hole 105.

The second conductive pattern 125d covers the first end of the hole 105 and extends so as to contact the inside of the first conductive pattern 125c. The second conductive pattern 125d extends beyond the first end of the hole 105 to form an overhang portion to cover the first end of the hole 105. An opening 123 surrounded by the first conductive pattern 125c and/or the second conductive pattern 125d is disposed in the hole 105. The opening 123 includes a first end adjacent to the first side 10 of the substrate 100a and a second end adjacent to the second side 20a of the substrate 100a.

According to an embodiment, the second conductive pattern 125d fully covers the inside of the first conductive pattern 125c. In this case, the first and second ends of the opening 123 are surrounded by and closed by the second conductive pattern 125d. Thus, the opening 123 is completely surrounded by the second conductive pattern 125d.

The first conductive pattern 125c includes at least one of polycrystalline silicon, metal (e.g., aluminum, copper, titanium, tantalum or tungsten) and conductive nitride (e.g., titanium nitride or tantalum nitride). The second conductive pattern 125d includes at least one of polycrystalline silicon, metal (e.g., aluminum, copper, titanium, tantalum or tungsten) and conductive nitride (e.g., titanium nitride or tantalum nitride). According to an embodiment, the second conductive pattern 125d includes PVD-conductive material. According to an embodiment, the first conductive pattern 125c includes the same material as the second conductive pattern 125d, but is formed by another method. For example, the first conductive pattern 125c includes copper formed by an electroplating process and the second conductive pattern 125d includes copper formed by a physical vapor deposition (PVD) process.

The through electrode 125 includes a first end surface adjacent to the first side 10 of the substrate 100a and a second end surface adjacent to the second side 20a of the substrate 100a. According to an embodiment, the shortest distance W5 between the first end surface of the through electrode 125 and the first end of the opening 123 is greater than the shortest distance W6 between the second end surface of the through electrode 125 and the second end of the opening 123. Thus, the center of the opening 123 is closer to the second side 20a of the substrate 100a than the first side 10 of the substrate 100a. Alternatively, the shortest distance W5 between the first end surface of the through electrode 125 and the first end of the opening 123 is smaller than the shortest distance W6 between the second end surface of the through electrode 125 and the second end of the opening 123. Thus, the center of the opening 123 is closer to the first side 10 of the substrate 100a than the second side 20a of the substrate 100a.

A method of forming a semiconductor chip in accordance with an embodiment of the inventive concept is described In connection with FIGS. 4A through 4F, which are cross sectional views illustrating a method of forming a semiconductor chip.

Figure 4A:
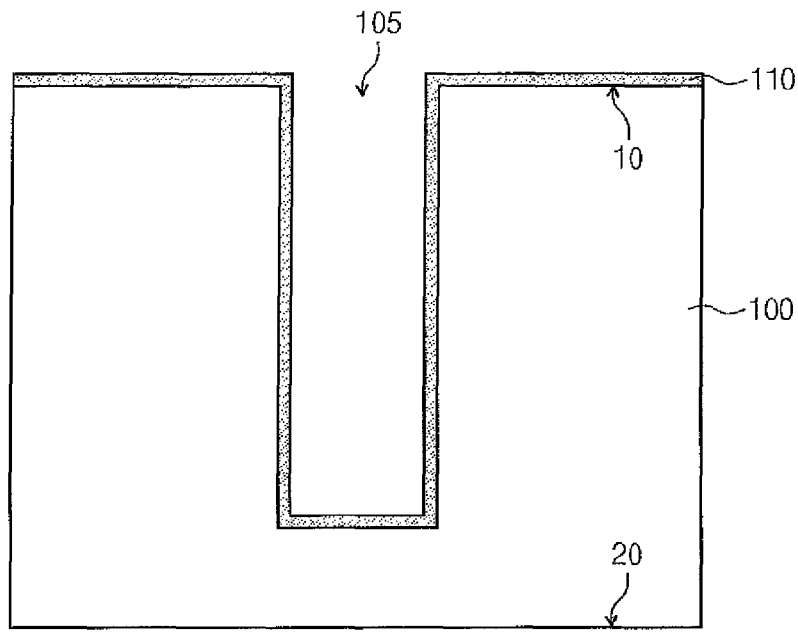
FIGS. 4A through 4F are cross sectional views illustrating a method of forming a semiconductor chip in accordance with another embodiment of the inventive concept.

Referring to FIG. 4A, a substrate 100 having a first side 10 and a second side 20 facing each other is prepared. The substrate 100 includes semiconductor material. For example, the substrate 100 includes at least one of silicon and germanium. The first side 10 of the substrate 100 includes at least one of a transistor, a diode, a capacitor and a resistor constituting a semiconductor device. According to an embodiment these structures are not formed on the second side 20 of the substrate 100.

A hole 105 extending from the first side 10 of the substrate 100 is formed in the substrate 100. The hole 105 may be formed by the same methods as in the embodiments described above. The hole 105 includes a first end adjacent to the first side 10 of the substrate 100 and a second end adjacent to the second side 20 of the substrate 100.

A first dielectric film 110 is formed on the first side 10 of the substrate 100. The first dielectric film 110 may be the same as that of the embodiments described above.

Figure 4B:
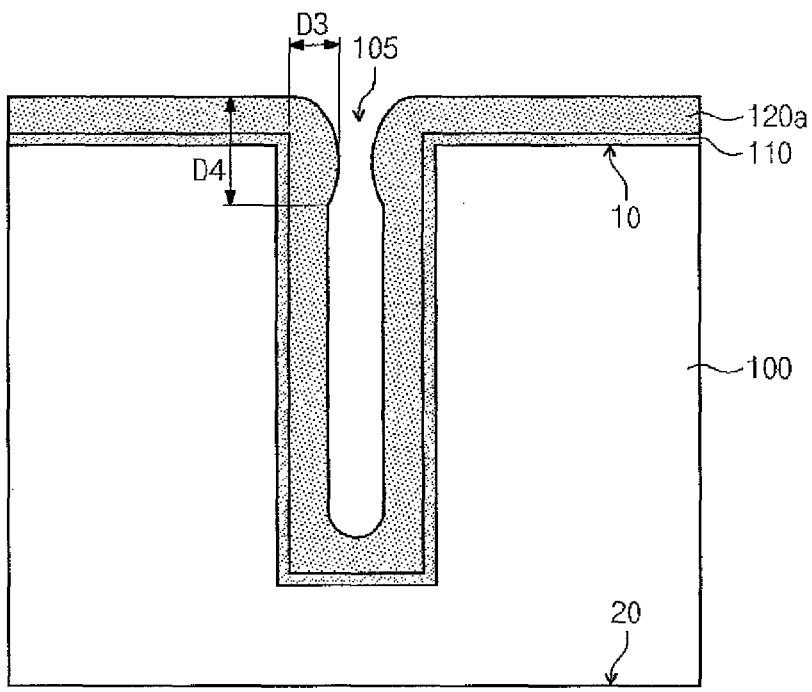

Referring to FIG. 4B, a first conductive film 120a is formed on the dielectric film 110 on the first side 10 of the substrate 100 and inside the hole 105. Thus, an inner space surrounded by the first conductive film 120a is formed in the hole 105. The first conductive film 120a may be formed by at least one of a chemical vapor deposition (CVD) process, a physical vapor deposition (PVD) process and an electroplating process.

Referring to FIG. 4B, the first conductive film 120a includes an overhang portion at the first end of the hole 105. The overhang portion causes the inner space at the first end of the hole 105 to have a width that is smaller than a width at the second end of the hole 105.

According to an embodiment, the first conductive film 120a is formed by an electroplating process. A thickness of the first conductive film 120a is controlled by controlling the amount of current being applied to the substrate 100 and a time during which the electroplating process is performed. For example, as the amount of current applied to the substrate 100 increases, a thickness of the first conductive film 120a increases and as the time for which the electroplating process progresses increases, a thickness of the first conductive film 120a increases.

Also, in the case that a critical amount of current is applied to the substrate 100 during the electroplating process, the overhang portion of the first conductive film 120a may occur at the first end of the hole 105. The critical amount of current may refer to the amount of current that causes the overhang portion to form at the first end of the hole 105. The overhang portion of the first conductive film 120a includes a first width D4 perpendicular to the substrate 100 and a second width D3 parallel to the substrate 100. If the amount of current applied to the substrate 100 is greater than the critical amount of current, as the amount of the current increases, the second width D3 increases and the first width D4 decreases.

Figure 4C:
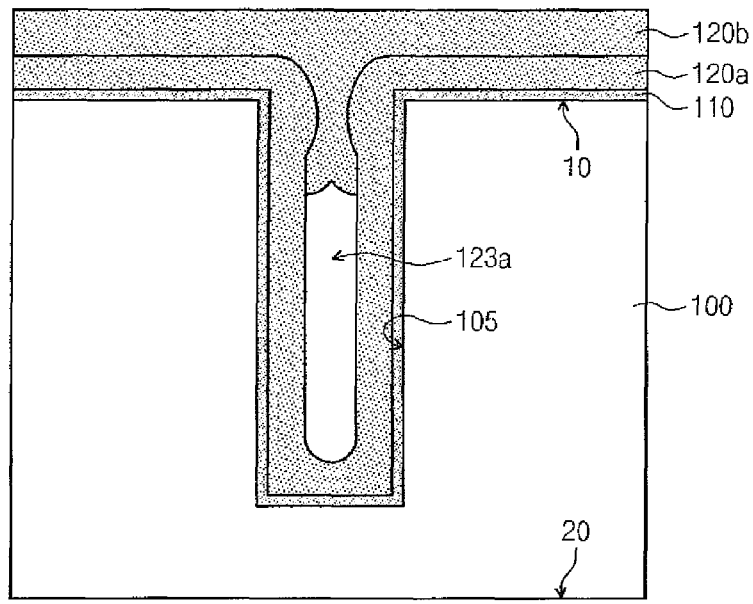

Referring to FIG. 4C, a second conductive film 120b closing the first end of the hole 105 is formed on the first conductive film 120a. An opening 123a surrounded by the first conductive film 120a and the second conductive film 120b is formed by the second conductive film 120b closing the first end of the hole 105. The opening 123a includes a first end adjacent to the first side 10 of the substrate 100 and a second end adjacent to the second side 20 of the substrate 100. The opening 123a is formed in the hole 105. The first and second ends of the opening 123s are closed by the first and second conductive films 120a and 120b. The first end of the opening 123a is closed by the second conductive film 120b and the second end of the opening 123a is closed by the first conductive film 120a. The opening 123a is completely surrounded by the combination of the first and second conductive films 120a and 120b.

The second conductive film 120b includes at least one of polycrystalline silicon, metal (e.g., aluminum, copper, titanium, tantalum or tungsten) and conductive nitride (e.g., titanium nitride or tantalum nitride). The second conductive film 120b may be fainted by at least one of a chemical vapor deposition (CVD) process, a physical vapor deposition (PVD) process and an electroplating process.

According to an embodiment, the first conductive film 120a and the second conductive film 120b are formed by different processes from each other. For example, the first conductive film 120a may be formed by an electroplating process and the second conductive film 120b may be formed by a physical vapor deposition (PVD) process.

In the case that the first conductive film 120a is formed by an electroplating process, before the second conductive film 120b is formed, a rinse process and a drying process are further performed. The rinse process may be performed using de-ionized water (DI). When the first conductive film 120a is formed by an electroplating process, chemical substances used in the electroplating process or chemical substances generated during the electroplating process may remain in an inner space of the first conductive film 120a. The chemical substances may be removed from the inner space of the first conductive film 120a by the rinse process and the drying process.

According to an embodiment, before the second conductive film 120b is formed, a degassing step is further performed. The degassing step is performed in a reaction chamber forming the second conductive film 120b. Alternatively, the degassing step is first performed in a chamber for degassing and then the second conductive film 120b is formed in a separate reaction chamber.

Figure 4D:
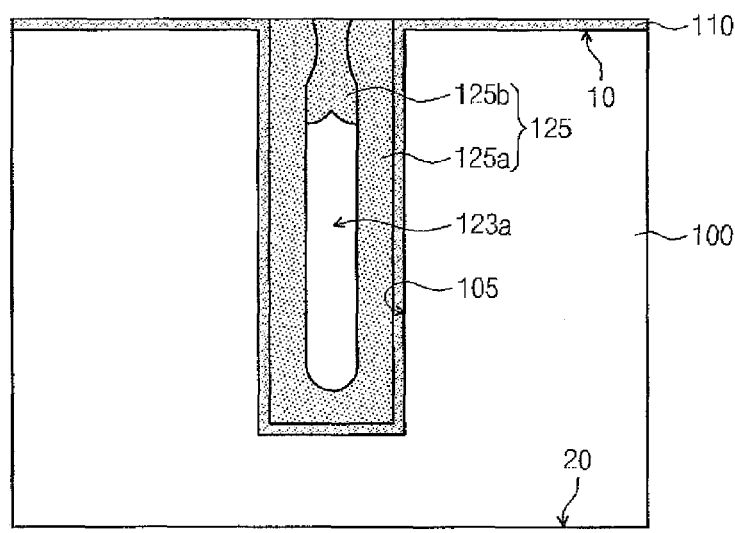

Referring to FIG. 4D, the first conductive film 120a and the second conductive film 120b outside of the hole 105 are removed to form a through electrode 125. The removal process is performed by at least one of a chemical mechanical polishing (CMP) process or a dry etching process.

The through electrode 125 includes a first conductive pattern 125a and a second conductive pattern 125b. The first end of the opening 123a is closed by the second conductive pattern 125b and the second end of the opening 123a is closed by the first conductive pattern 125a. Since the opening 123a is formed in the hole 105, even though the first and second conductive films 120a and 120b outside of the hole 105 are removed by the removal process, the opening 123a remains closed (i.e., surrounded by the first and second conductive patterns 125a and 125b). That is, the first and second ends of the opening 123a are maintained a closed state by the through electrode 125.

The through electrode 125 includes a first end surface adjacent to the first side 10 of the substrate 100 and a second end surface adjacent to the second side 20 of the substrate 100. In the case that the second conductive film 120b is formed by a physical vapor deposition (PVD) process, as a pressure increases in a physical vapor deposition process, step coverage of the second conductive film 120b may deteriorate.

According to an embodiment, if step coverage of the second conductive film 120b is deteriorated, the shortest distance between the first end surface of the through electrode 125 and the first end of the opening 123a is smaller than the shortest distance between the second end surface of the through electrode 125 and the second end of the opening 123a. Thus, the center of the opening 123 is formed to be closer to the first end of the hole 105 than the second end of the hole 105. Alternatively, in the case that the shortest distance between the first end surface of the through electrode 125 and the first end of the opening 123 is greater than the shortest distance between the second end surface of the through electrode 125 and the second end of the opening 123, the center of the opening 123 is formed to be closer to the second end of the hole 105 than the first end of the hole 105.

According to an embodiment, as a bias power increases during a physical vapor deposition process, the shortest distance between the first end surface of the through electrode 125 and the first end of the opening 123a increases. That is, the center of the opening 123 is formed to be closer to a bottom surface of the hole 105 than to the entrance of the hole 105.

According to an embodiment, as the first width D4 of overhang portion of the first conductive film 120a increases, the shortest distance between the first end surface of the through electrode 125 and the first end of the opening 123a increases. That is, the center of the opening 123a is foamed to be closer to a bottom surface of the hole 105 than to the entrance of the hole 105.

Figure 4E:
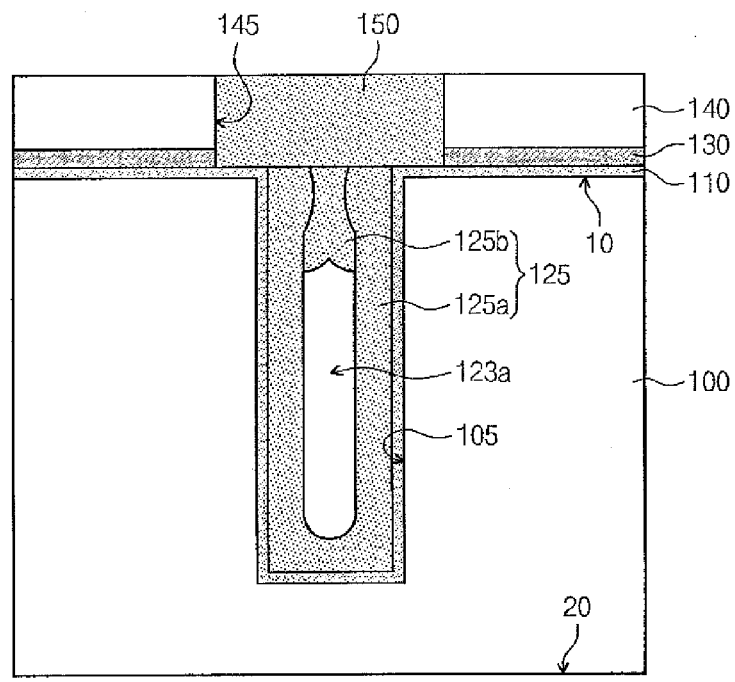

Referring to FIG. 4E, an etch stop film 130 and an interlayer dielectric film 140 are formed on the first side 10 of the substrate 100. The etch stop film 130 and the interlayer dielectric film 140 may be the same as those of the embodiments described above.

The etch stop film 130 and the interlayer dielectric film 140 are sequentially patterned to form an opening 145 exposing the through electrode 125 at the first side 10 of the substrate 100. An interconnection 150 electrically connected to the through electrode 125 is formed in the opening 145. The interconnection 150 may be the same with that of the embodiments described above.

Alternatively, the interconnection 150 is formed by a patterning process by forming a conductive film on the first side 10 of the substrate 100 and then patterning the conductive film. The interlayer dielectric film 140 and/or the etch stop film 130 are formed on the first side 10 of the substrate 100 after forming the interconnection 150 by the patterning process.

In FIG. 4E, the interconnection 150 is illustrated as a single layer. However, the embodiments of the present inventive concept are not limited thereto. Unlike that illustrated in FIG. 4E, multilayer interconnections electrically connected to the through electrode 125 are formed on the first side 10 of the substrate 100.

Figure 4F:
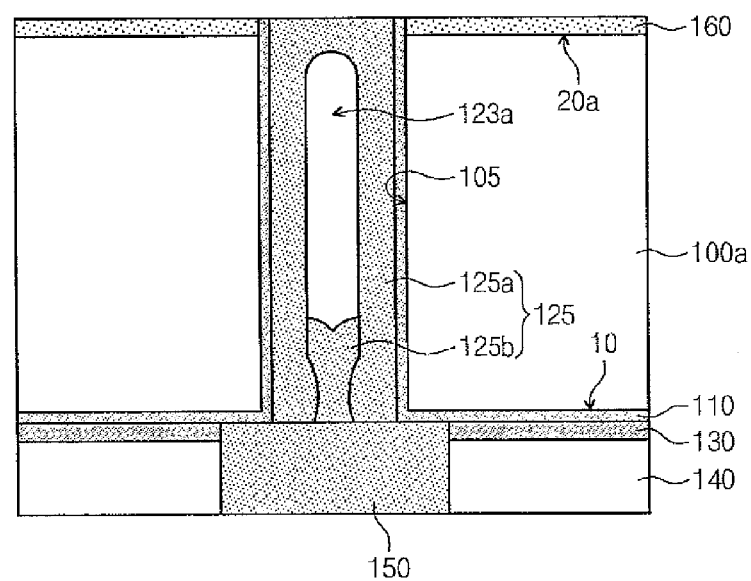

Referring to FIG. 4F, the through electrode 125 adjacent to the second side 20 of the substrate 100 is exposed by etching the second side 20 of the substrate 100 and a portion of the first dielectric film 110. An etched substrate 100a and an etched second side 20a are defined by etching the second side 20 of the substrate 100.

A thickness of the substrate 100 is reduced by the etching process. Also, according to an embodiment, a portion of the first dielectric film 110 covering the through electrode 125 is removed by the etching process. The etching process is performed by at least one of a grinding process, a dry etching process, a wet etching process and a chemical mechanical polishing (CMP) process.

A second dielectric film 160 is formed on the etched second side 20a of the etched substrate 100a. The second dielectric film 160 includes an open portion exposing the through electrode 125. The second dielectric film 160 may be the same as that of the embodiments described above.

According to an embodiment, as illustrated in FIG. 3A, a bump 170 connected to the exposed through electrode 125 is further formed. The bump 170 includes a first conductive pad 173 and a second conductive pad 175. The first and second conductive pads 173 and 175 include metal. For example, the first and second conductive pads 173 and 175 include at least one of aluminum, copper and nickel.

Figure 5A:
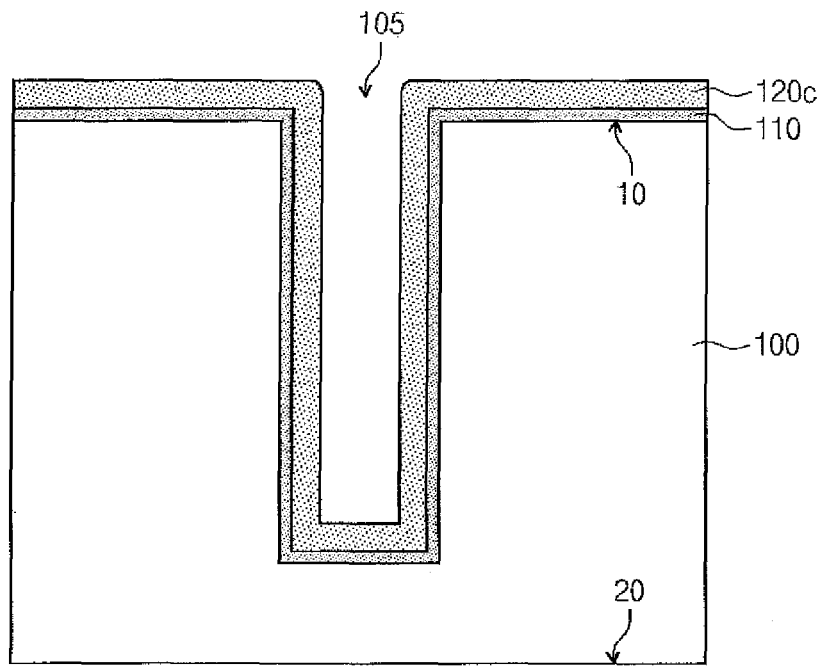
FIGS. 5A through 5C are cross sectional views illustrating an embodiment of a method of forming a through electrode in a method of forming a semiconductor chip in accordance with another embodiment of the inventive concept.
Figure 5B:
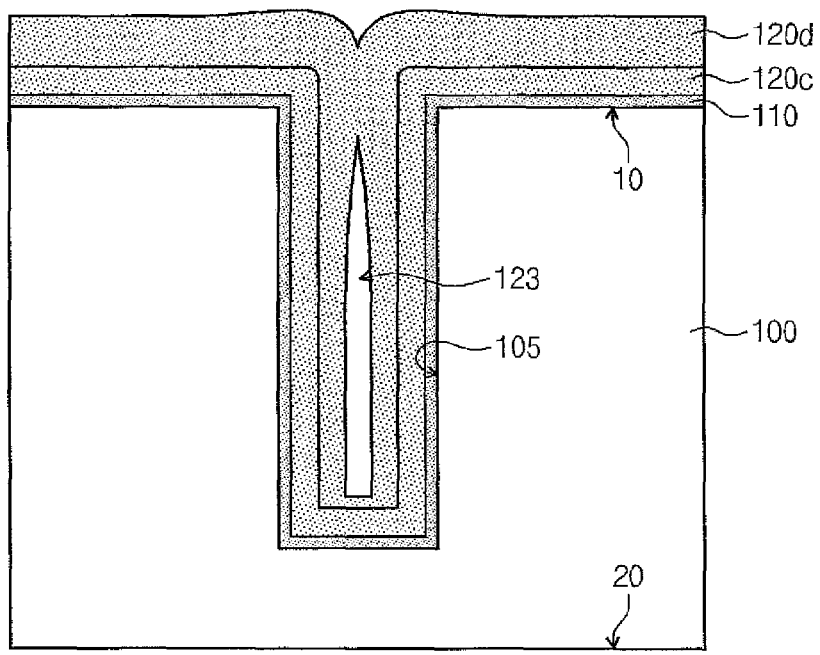
Figure 5C:
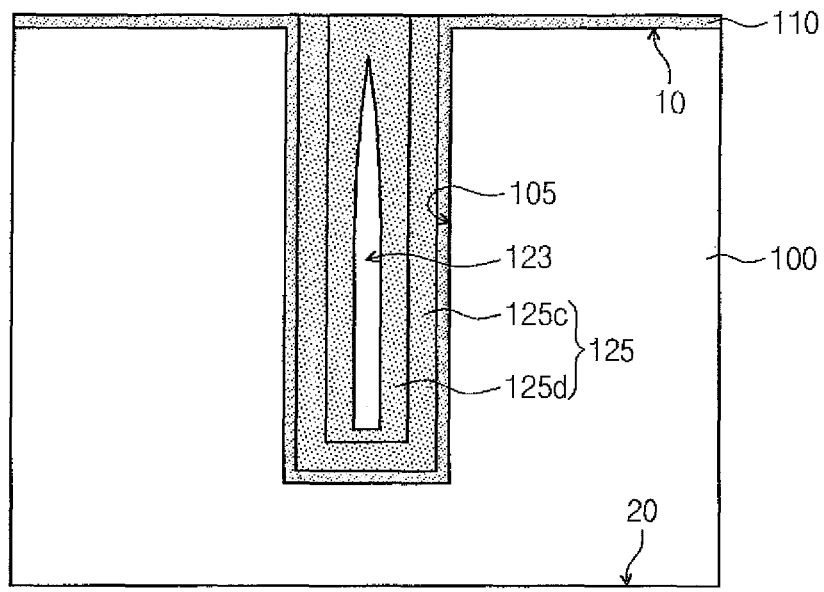

FIGS. 5A through 5C are cross sectional views illustrating a method of forming a through electrode in accordance with another embodiment of the inventive concept.

Referring to FIG. 5A, a hole 105 is formed in a substrate 100 having a first side 10 and a second side 20 facing each other. The hole 105 includes a first end adjacent to the first side 10 of the substrate 100 and a second end adjacent to the second side 20 of the substrate 100.

A first conductive film 120c is formed on the first side 10 of the substrate 100 and inside the hole 105. Accordingly, an inner space surrounded by the first conductive film 120c is formed inside the hole 105. The first conductive film 120c is formed by at least one of a chemical vapor deposition (CVD) process, a physical vapor deposition (PVD) process and an electroplating process.

According to an embodiment, the first conductive film 120c is formed by an electroplating process. A thickness of the first conductive film 120c is controlled by controlling the amount of current being applied to the substrate 100 and a time during which the electroplating process is performed. For example, as the amount of current applied to the substrate 100 increases, a thickness of the first conductive film 120c increases and as the time during which the electroplating process is performed increases, a thickness of the first conductive film 120c increases.

Also, although not illustrated in the drawing, if a critical amount of current is applied to the substrate 100 during the electroplating process, an overhang may occur in the first conductive film 120c covering all or part of the entrance of the hole 105. The critical amount of current may refer to the amount of current required to begin formation of an overhang portion at the entrance of the hole 105.

Referring to FIG. 5B, a second conductive film 120d closing the first end of the hole 105 is formed on the first conductive film 120c. The second conductive film 120d is formed on the inside of the first conductive film 120c. The second conductive film 120d is formed to include an overhang portion at the first end of the hole 105 to cover the first end of the hole 105. An opening 123 surrounded by the first conductive film 120c and/or the second conductive film 120d is formed in the hole 105. The opening 123 includes a first end adjacent to the first side 10 of the substrate 100 and a second end adjacent to the second side 20 of the substrate 100. An overhang portion of the second conductive film 120d at the first end of the hole 105 includes a first width perpendicular to the substrate 100 and a second width parallel to the substrate 100.

The second conductive film 120d includes at least one of polycrystalline silicon, metal (e.g., aluminum, copper, titanium, tantalum or tungsten) and conductive nitride (e.g., titanium nitride or tantalum nitride). The second conductive film 120d is formed by a chemical vapor deposition (CVD) process or a physical vapor deposition (PVD) process. According to an embodiment, the first conductive film 120c and the second conductive film 120d are formed by different processes from each other. For example, the first conductive film 120c may be formed by an electroplating process and the second conductive film 120d may be formed by a physical vapor deposition (PVD) process.

In the case that the first conductive film 120c is formed by an electroplating process, before the second conductive film 120d is formed, a rinse process and a drying process are further performed. The rinse process and the drying process may be the same as those of the embodiments described above.

According to an embodiment, before the second conductive film 120d is formed, a degassing step is performed. The degassing step may be the same as that of the embodiments described above.

Referring to FIG. 5C, the first conductive film 120c and the second conductive film 120d outside of the hole 105 are removed to form a through electrode 125. The removal process is performed by at least one of a chemical mechanical polishing (CMP) process or a dry etching process.

The through electrode 125 includes a first conductive pattern 125c and a second conductive pattern 125d. The first and second ends of the opening 123 are closed by the combination of the first conductive pattern 125c and the second conductive pattern 125d. Since the opening 123 is formed in the hole 105, even though the first and second conductive films 120c and 120d outside of the hole 105 are removed by the removal process, the opening 123 is not opened (i.e., remains surrounded by the first and second conductive patterns 125c and 125d. That is, the first and second ends of the opening 123 are maintained in a closed state by the through electrode 125.

According to an embodiment, the second conductive pattern 125d fully covers the inside of the first conductive pattern 125c. In this case, the first and second ends of the opening 123 may be closed by the first and second conductive patterns 125c, 125d. The opening 123 is completely surrounded by the second conductive pattern 125d, and the conductive pattern is bordered on at least three sides by the first conductive pattern 125c.

The through electrode 125 includes a first end surface adjacent to the first side 10 of the substrate 100 and a second end surface adjacent to the second side 20 of the substrate 100. In the case that the second conductive film 120d is formed by a physical vapor deposition (PVD) process, as a pressure increases during the physical vapor deposition process, step coverage of the second conductive film 120d may deteriorate.

According to an embodiment, if step coverage of the second conductive film 120b is deteriorated, the first width of overhang portion of the second conductive film 120d is reduced. As a result, the shortest distance between the first end surface of the through electrode 125 and the first end of the opening 123 is smaller than the shortest distance between the second end surface of the through electrode 125 and the second end of the opening 123. Thus, the center of the opening 123 is formed to be closer to the first end of the hole 105 than the second end of the hole 105. In the case that step coverage of the second conductive film 120b is improved, the first width of overhang portion of the second conductive film 120d increases. As a result, the shortest distance between the first end surface of the through electrode 125 and the first end of the opening 123 is greater than the shortest distance between the second end surface of the through electrode 125 and the second end of the opening 123. Thus, the center of the opening 123 is formed to be closer to the second end of the hole 105 than the first end of the hole 105.

As described above, in a semiconductor chip in accordance with embodiments of the inventive concept, a through electrode is disposed in a hole penetrating a substrate and an opening is disposed inside the through electrode. That is, the through electrode is formed without wholly filling the hole. Thus, unwanted damage and/or rearrangements that may occur due to a thermal expansion of the through electrode by a high temperature process performed after forming the through electrode are minimized. Accordingly, a semiconductor chip having improved reliability and electrical characteristics is formed.

Although a few embodiments of the present inventive concept have been shown and described, it will be appreciated by those skilled in the art that changes may be made in these embodiments without departing from the principles and spirit of the inventive concept, the scope of which is defined in the appended claims. Therefore, the above-disclosed subject matter is meant to be illustrative, and not restrictive.

What is claimed is:

1. A method of manufacturing a semiconductor chip comprising:

forming a hole in a substrate extending from a first side of the substrate toward a second side of the substrate, wherein the first side and the second side face each other;

forming a first conductive film on the first side of the substrate and on an inside surface of the hole using an electroplating process;

forming a second conductive film on the first side of the substrate using a physical vapor depositing process, wherein the first and second films partially fill the hole to leave an opening in the hole;

removing portions of the first and second conductive films outside of the hole to form a through electrode including a first conductive pattern and a second conductive pattern in the hole, wherein the opening comprises an inner space surrounded by the first and second conductive patterns; and etching the second side of the substrate to expose the through electrode.

2. The method of claim 1, wherein the second conductive film closes an end of the inner space adjacent to the first side of the substrate.

3. The method of claim 1, wherein the second conductive film is also formed on an inside surface of the first conductive film in part of the inner space.

4. The method of claim 1, wherein the first conductive film and the second conductive film comprise the same material.

5. The method of claim 1, further comprising, before forming the second conductive film, performing a rinse process and a dry process on the substrate on which the first conductive film is formed.

6. The method of claim 5, further comprising, after performing the rinse process and the dry process and before forming the second conductive film, performing a degassing process.

7. The method of claim 1, further comprising:
conformally forming a first dielectric film in the hole before forming the first conductive film; and
forming a second dielectric film on the etched second side of the substrate after forming the through electrode.

8. The method of claim 1, wherein the first conductive film includes an overhang portion at an entrance end of the hole.

9. The method of claim 1, wherein the first conducive pattern comprises a U-shaped pattern including an open toward the first side of the substrate, and the second conductive pattern closes the open end of the U-shaped pattern.

* * * * *